(12) United States Patent
Karidis et al.

(10) Patent No.: US 7,842,552 B2
(45) Date of Patent: Nov. 30, 2010

(54) SEMICONDUCTOR CHIP PACKAGES HAVING REDUCED STRESS

(75) Inventors: John Peter Karidis, Ossining, NY (US); Mark Delorman Schultz, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 11/871,204

(22) Filed: Oct. 12, 2007

(65) Prior Publication Data
US 2009/0096084 A1 Apr. 16, 2009

(51) Int. Cl.
*H01L 21/58* (2006.01)
*H01L 23/14* (2006.01)

(52) U.S. Cl. .......... 438/121; 438/125; 257/680; 257/693; 257/701; 257/729; 257/E23.023; 257/E23.194; 257/E23.06; 257/E23.181; 257/E23.191; 257/E23.193; 257/E21.5; 257/E21.511

(58) Field of Classification Search ......... 257/677–733, 257/E23.001–E23.194, 737–738, E21.511, 257/E21.5, E23.023, E23.06, E21.505, E21.506–E21.519; 438/15, 106–127
See application file for complete search history.

(56) References Cited

U.S. PATENT DOCUMENTS

| | | | | |
|---|---|---|---|---|
| 5,909,057 A | * | 6/1999 | McCormick et al. | 257/704 |
| 6,046,077 A | * | 4/2000 | Baba | 438/127 |
| 6,502,926 B2 | * | 1/2003 | Cook et al. | 347/63 |
| 7,459,782 B1 | * | 12/2008 | Li, Yuan | 257/702 |
| 7,504,718 B2 | * | 3/2009 | Gaynes et al. | 257/686 |
| 2001/0033017 A1 | * | 10/2001 | Wang et al. | 257/698 |
| 2001/0052647 A1 | * | 12/2001 | Plepys et al. | 257/738 |
| 2004/0150118 A1 | * | 8/2004 | Honda | 257/778 |
| 2008/0057625 A1 | * | 3/2008 | Chan et al. | 438/113 |

* cited by examiner

*Primary Examiner*—Matthew C Landau
*Assistant Examiner*—Aaron Staniszewski
(74) *Attorney, Agent, or Firm*—Schmeiser, Olsen & Watts; Daniel P. Morris (57) ABSTRACT

A structure and a method for forming the same. The structure includes (i) a carrier substrate which includes substrate pads, (ii) a chip physically attached to the carrier substrate, and (iii) a first frame physically attached to the carrier substrate. A CTE (coefficient of thermal expansion) of the first frame is substantially lower than a CTE of the carrier substrate.

17 Claims, 8 Drawing Sheets

SEMICONDUCTOR CHIP PACKAGES HAVING REDUCED STRESS

FIELD OF THE INVENTION

The present invention relates generally to semiconductor chip packages and more particularly to semiconductor chip packages having reduced stress.

BACKGROUND OF THE INVENTION

In a conventional chip packaging process, a chip is placed on a carrier substrate such that the solder balls of the chip are in direct physical contact one-to-one with substrate pads of the carrier substrate. Then, the temperature of the carrier substrate and the chip is raised to a bonding temperature where the solder balls of the chip melt and bond to the substrate pads. After that, the carrier substrate and the chip are cooled down. Because the CTE (coefficient of thermal expansion) of the chip is smaller than the CTE of the carrier substrate, the difference between shrink rates of the carrier substrate and the chip during the cooling down results in stress on the solder balls and underlying structures of the chip. Therefore, there is a need for a structure (and a method for forming the same) in which the chip packaging process is performed with reduced stress on the solder balls and underlying structure of the chip.

SUMMARY OF THE INVENTION

The present invention provides a structure, comprising a carrier substrate which includes substrate pads; a chip physically attached to the carrier substrate; and a first frame physically attached to the carrier substrate, wherein a CTE (coefficient of thermal expansion) of the first frame is substantially lower than a CTE of the carrier substrate.

The present invention provides a structure (and a method for forming the same) in which the chip packaging process is performed with reduced stress on the solder balls and underlying structure of the chip.

DETAILED DESCRIPTION OF THE INVENTION

Figure 1A:
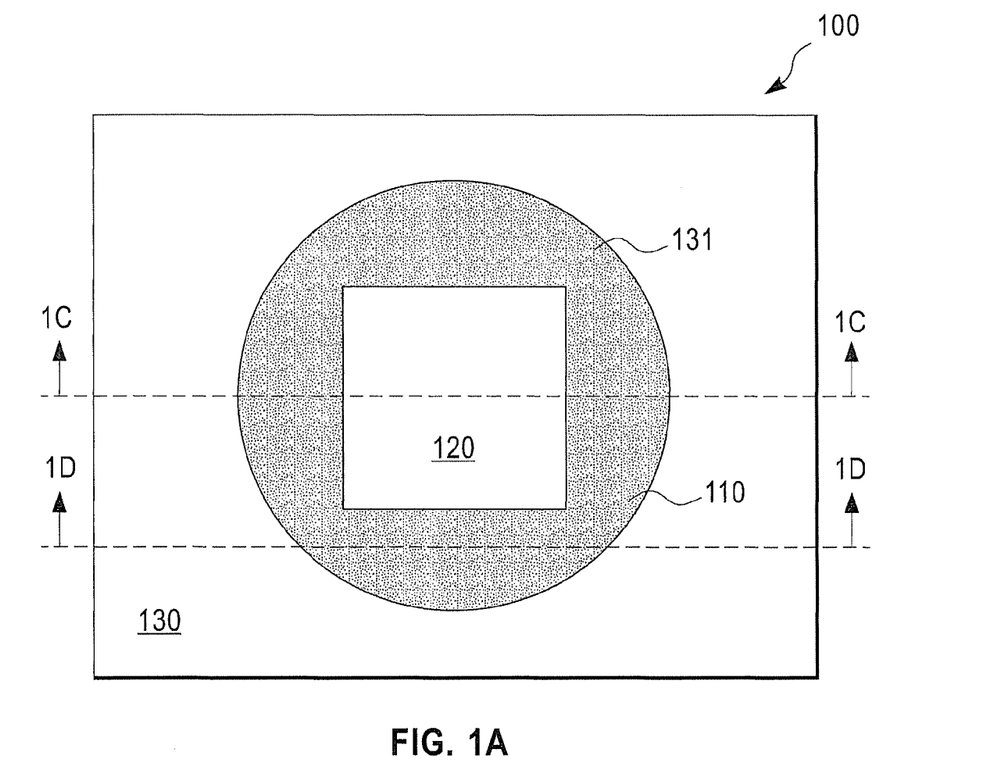
FIG. 1A shows a top-down view of a first semiconductor structure, in accordance with embodiments of the present invention.
Figure 1B:
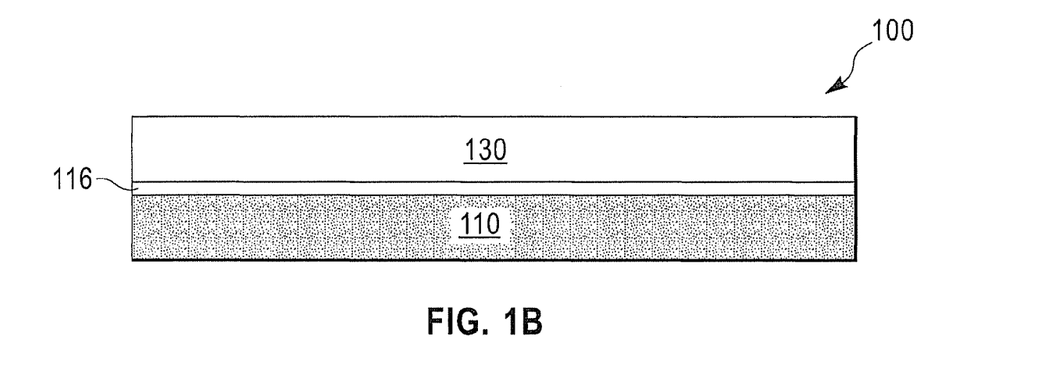
FIG. 1B shows a side-view of the first semiconductor structure of FIG. 1A, in accordance with embodiments of the present invention.
Figure 1C:
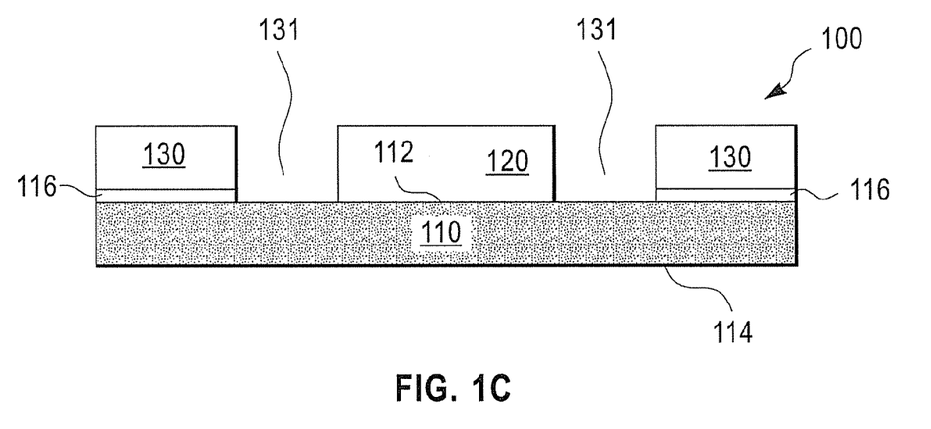
FIGS. 1C and 1D show cross-section views of the first semiconductor structure of FIG. 1A along lines 1C-1C and 1D-1D of FIG. 1A, respectively, in accordance with embodiments of the present invention.
Figure 1D:
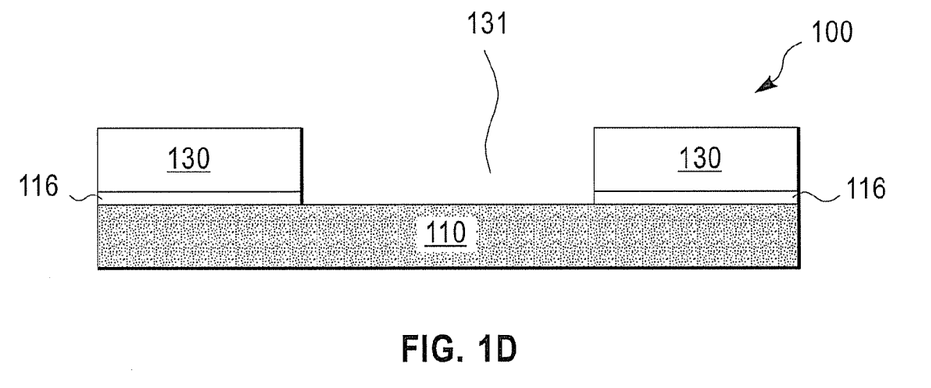

FIG. 1A shows a top-down view of a semiconductor structure 100, in accordance with embodiments of the present invention. More specifically, the structure 100 comprises a carrier substrate 110, a semiconductor chip 120, and a frame 130. The frame 130 has a circular hole 131 at the center of the frame 130. The semiconductor chip 120 and the frame 130 are physically attached to the carrier substrate 110. FIG. 1B shows a side-view of the structure 100 of FIG. 1A. FIGS. 1C and 1D show cross-section views of the structure 100 along lines 1C-1C and 1D-1D, respectively. In one embodiment, as shown in FIGS. 1B and 1C, the frame 130 can be attached to the carrier substrate 110 by an adhesive layer 116.

With reference to FIGS. 1A and 1C, in one embodiment, the fabrication of the structure 100 (also called the packaging of the chip 120) starts with the carrier substrate 110. The carrier substrate 110 can comprise substrate pads (not shown) at the top surface 112 and pins (not shown) at the bottom surface 114 of the carrier substrate 110. The pins are electrically connected to the substrate pads through electrically conductive wires (not shown) in the carrier substrate 110.

Next, in one embodiment, the chip 120 with solder balls (not shown) is placed onto the carrier substrate 110 such that the solder balls of the chip 120 are in direct physical contact one-to-one with the substrate pads of the carrier substrate 110. The chips 120 can be placed onto the carrier substrate 110 at room temperature that is around 23° C.-25° C.

Next, in one embodiment, the structure 100 is heated up to a bonding temperature where the solder balls of the chip 120 melt and bond to the substrate pads (also called attachment solder reflow process). The bonding temperature can be around 200-250 degrees C. As a result, the solder balls of the chip 120 are physically attached to the substrate pads of the carrier substrate 110. While the carrier substrate 110 is at the highest temperature (i.e., bonding temperature), the frame 130 can be attached to the top surface 112 of the carrier substrate 110 by the adhesive layer 116.

In one embodiment, the carrier substrate 110 can comprise organic material or ceramic material. The CTE (coefficient of thermal expansion) of the carrier substrate 110 can be in the range of 15-30 ppm/° C., whereas the CTE of the semiconductor chip 120 can be around 3 ppm/° C. The frame 130 can comprise a material that has CTE smaller than the CTE of the carrier substrate 110. In one embodiment, the CTE of the frame 130 is significantly lower than the CTE of the carrier substrate 110. In one embodiment, the CTE of the frame 130 is smaller than 50% of the CTE of the carrier substrate 110. Preferably, the CTE of the frame 130 is close to the CTE of the chip 120 (i.e., around 3 ppm/° C.). In one embodiment, the CTE of the frame 130 is smaller than the CTE of the chip 120. The frame 130 can comprise glass-ceramic, quartz, or low CTE metal alloy such as nickel-iron.

Next, in one embodiment, the structure 100 is cooled down to room temperature (also called initial cool down process) resulting in the shrinkage of the carrier substrate 110, the chip 120, and the frame 130. Assume that the initial cool down process is carried out without the frame 130 being attached to the carrier substrate 110 as described above. As a result, because the CTE of the carrier substrate 110 (15-30 ppm/° C.) is greater than the CTE of the chip 120 (3 ppm/° C.), during the initial cool down process, the shrink rate of the carrier substrate 110 is greater than the shrink rate of the chip 120. As a result, the difference between the shrink rates of the carrier substrate 110 and the chip 120 causes stress on the solder balls and underlying structure of the chip 120.

With the presence of the frame 130 being attached to the carrier substrate 110, because the CTE of the frame 130 (e.g., 3 ppm/° C.) is smaller than the CTE of the carrier substrate 110 (15-30 ppm/° C.), during the initial cool down process, the shrink rate of the frame 130 is smaller than the shrink rate of the carrier substrate 110. As a result, the frame 130 helps reduce the shrink rate of the carrier substrate 110. Therefore, the frame 130 helps reduce the difference between the shrink rates of the carrier substrate 110 and the chip 120 resulting in less stress on the solder balls and underlying structure of the chip 120 than in the case without the presence of the frame 130. In other words, when the frame 130 is attached to the surface 112 of the carrier substrate 110 via the adhesive 116, the cooling of the structure 100 results in a rate of shrinkage of the carrier substrate 110 below that resulting from just the carrier substrate 110 alone. The reduction in the rate of shrinkage on cooling is due to the frame 130 having a substantially lower CTE than the carrier substrate 110.

Figure 2A:
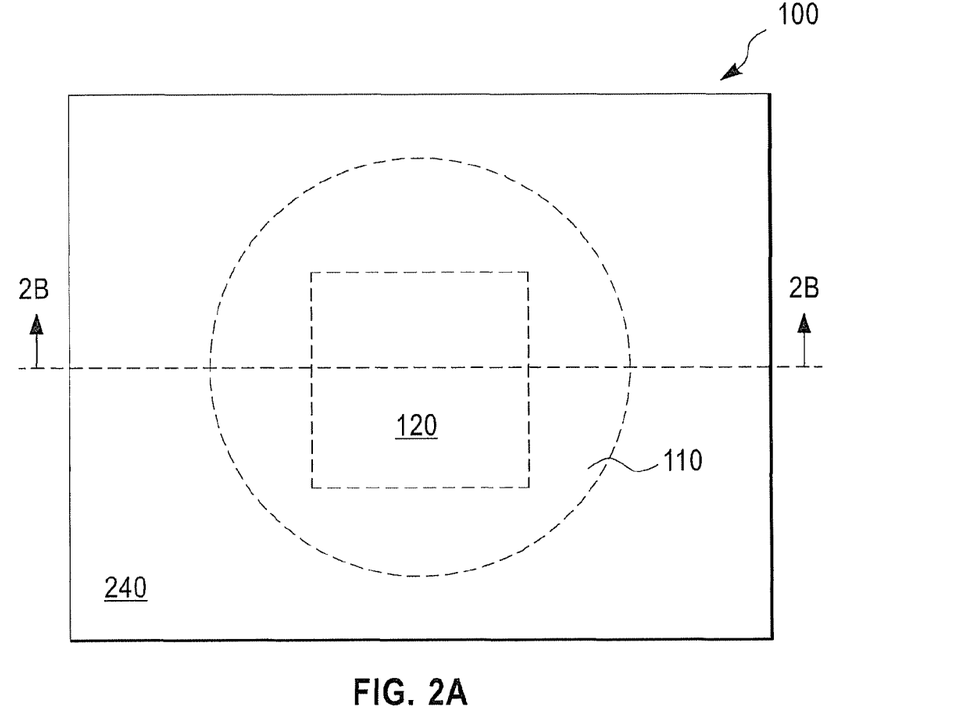
FIG. 2A shows a top-down view of the first semiconductor structure of FIG. 1A with a lid, in accordance with embodiments of the present invention.
Figure 2B:
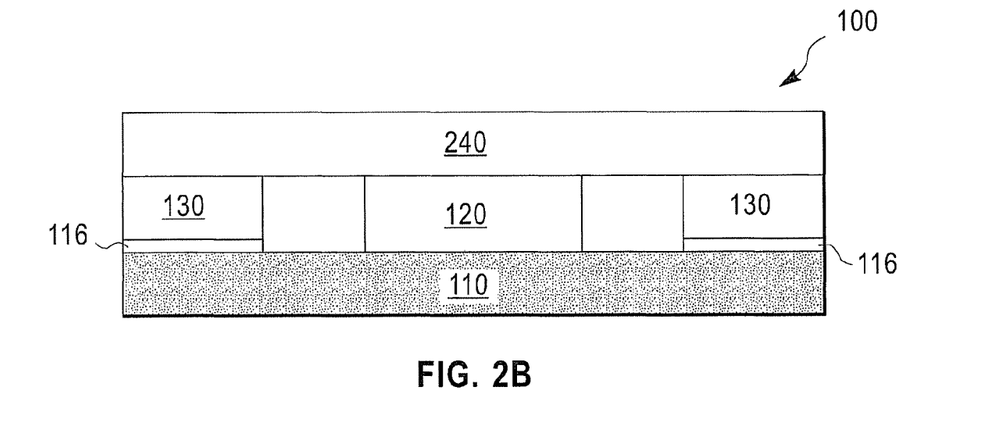
FIG. 2B shows a cross-section view of the first semiconductor structure of FIG. 2A, in accordance with embodiments of the present invention

Next, with reference to FIG. 2A (top-down view) and FIG. 2B (cross-section view of structure of FIG. 2A along a line 2B-2B), in one embodiment, a lid 240 is attached to the chip 120 and the frame 130 by adhesive.

In summary, the frame 130 that has CTE smaller than the CTE of the carrier substrate 110 is attached to the carrier substrate 110 at the end of the attachment solder reflow process. As a result, during the subsequent initial cool down process, because the shrink rate of the frame 130 is smaller than the shrink rate of the carrier substrate 110, the difference between the shrink rates of the carrier substrate 110 and the chip 120 is reduced resulting in a smaller stress on the solder balls and underlying structure of the chip 120 than in the case in which the frame 130 is not attached to the carrier substrate 110.

Figure 3A:
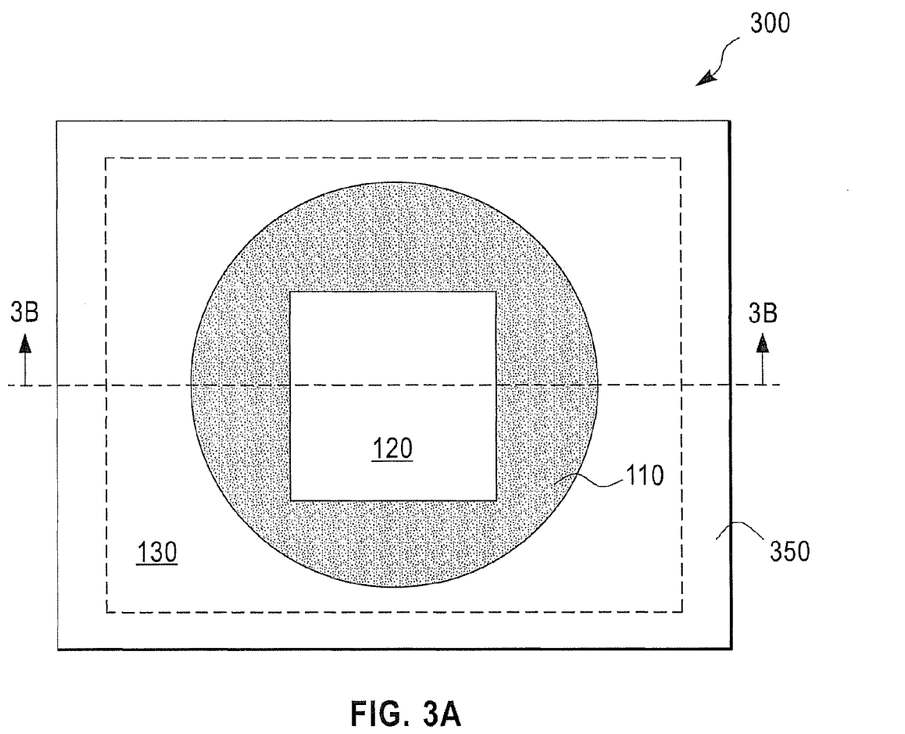
FIG. 3A shows a top-down view of a second semiconductor structure, in accordance with embodiments of the present invention.
Figure 3B:
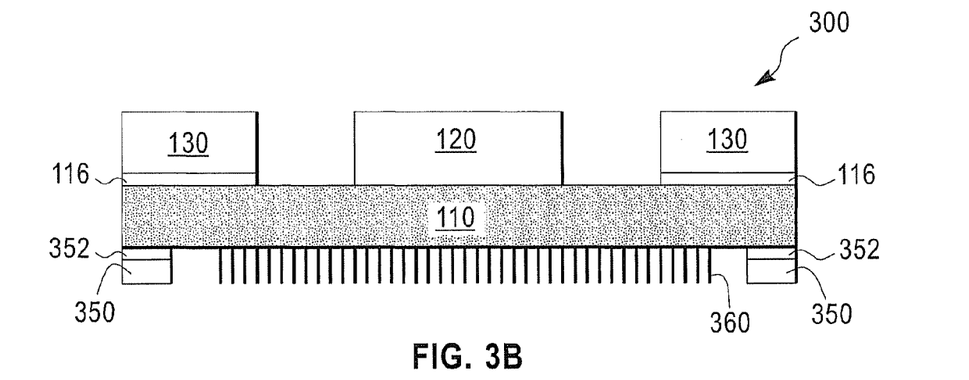
FIG. 3B shows a cross-section view of the second semiconductor structure of FIG. 3A along a line 3B-3B of FIG. 3A, in accordance with embodiments of the present invention.

FIG. 3A shows a top-down view of a semiconductor structure 300, in accordance with embodiments of the present invention. FIG. 3B shows a cross-section view of the structure 300 along a line 3B-3B.

With reference to FIGS. 3A and 3B, the structure 300 is similar to the structure 100 of FIG. 1C, except that the structure 300 further comprises a frame 350. As shown in FIG. 3B, the carrier substrate 110 comprises the pins 360. It should be noted that, in FIGS. 1B-1D and 2B, the pins 360 of the carrier substrate 110 are not shown for simplicity. The frame 350 can comprise a material that has CTE similar to the CTE of the frame 130. The frame 350 can be attached to the carrier substrate 110 by an adhesive layer 352.

While the carrier substrate 110 is at the highest temperature of the attachment solder reflow process, the frame 350 can be attached to the carrier substrate 110. The frame 350 and the frame 130 can be attached to the carrier substrate 110 at the same time. With the presence of the frame 350 being attached to the carrier substrate 110, during the initial cool down process, the frame 350 helps reduce further the shrink rate of the carrier substrate 110. Therefore, the frame 350 helps reduce further the difference between the shrink rates of the carrier substrate 110 and the chip 120 resulting in further reduction in stress on the solder balls and underlying structure of the chip 120 compared with the case without the presence of the frame 350.

Figure 4A:
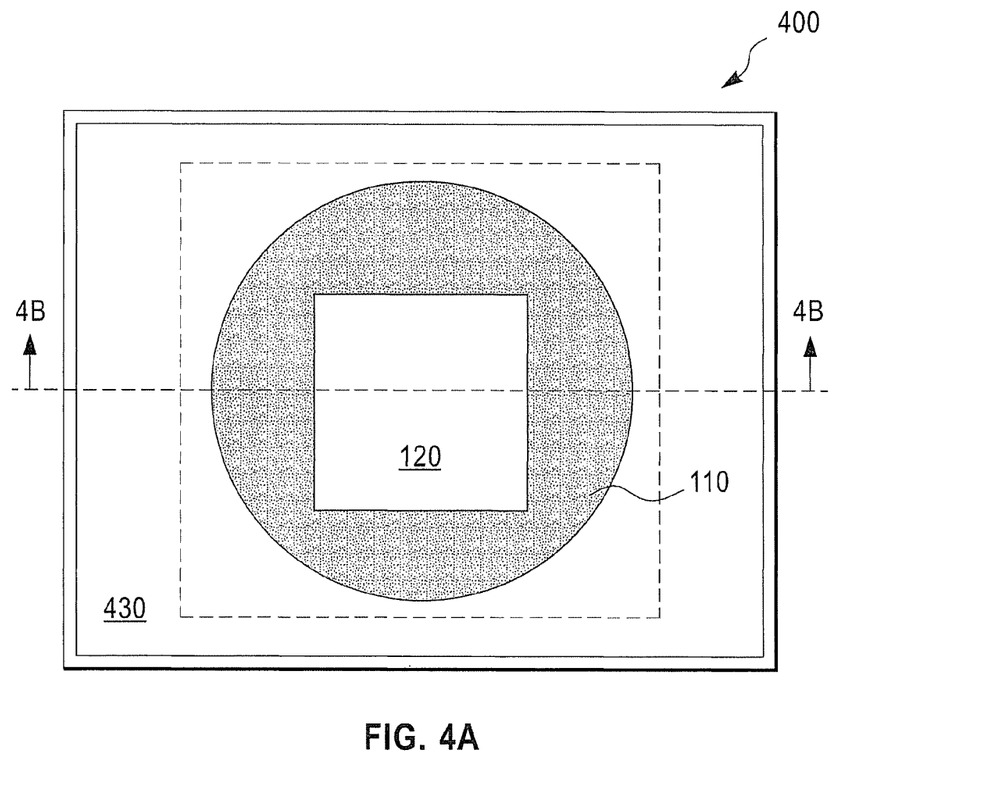
FIG. 4A shows a top-down view of a third semiconductor structure, in accordance with embodiments of the present invention.
Figure 4B:
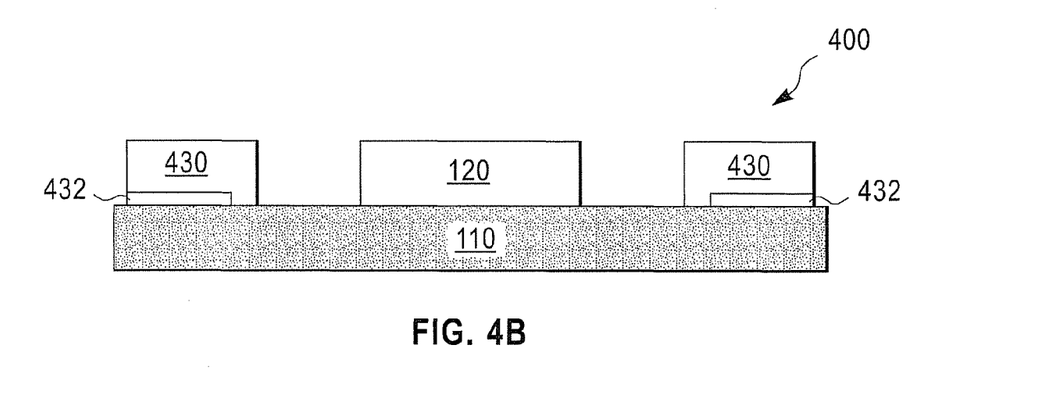
FIG. 4B shows a cross-section view of the third semiconductor structure of FIG. 4A along a line 4B-4B of FIG. 4A, in accordance with embodiments of the present invention.

FIG. 4A shows a top-down view of a semiconductor structure 400, in accordance with embodiments of the present invention. FIG. 4B shows a cross-section view of the structure 400 along a line 4B-4B.

With reference to FIGS. 4A and 4B, the structure 400 is similar to the structure 100 of FIGS. 1A and 1C, except that the frame 430 has a gap 432 at outer peripheral area of the frame 430. The structure 400 of FIGS. 4A and 4B can be formed in a manner similar to the manner in which the structure 100 of FIGS. 1A-1D is formed, except that the gap 432 can be filled with a low viscosity adhesive which is cured by a high temperature (bonding temperature) during the attachment solder reflow process. In one embodiment, this type of adhesive would be applied and cured at a desired temperature (generally 150° C.-200° C.) prior to the attachment solder reflow process. The possibility of the frame attachment prior to the attachment solder reflow process exists for any adhesive frame attachment.

Figure 5A:
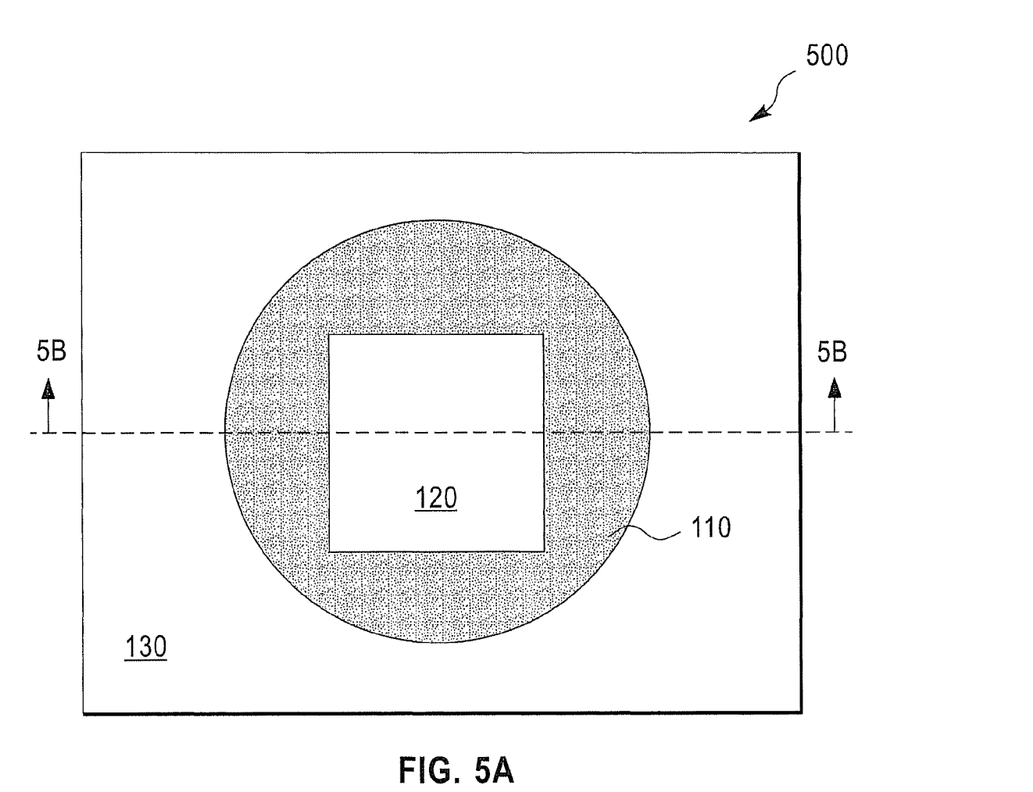
FIG. 5A shows a top-down view of a fourth semiconductor structure, in accordance with embodiments of the present invention.
Figure 5B:
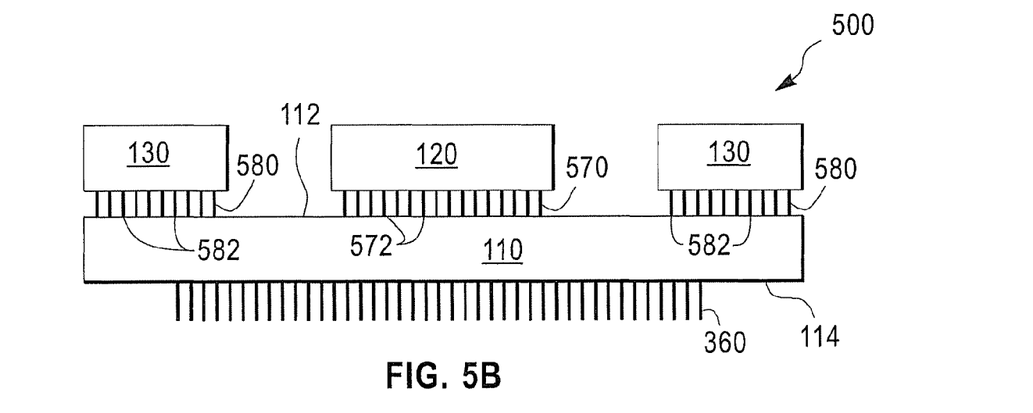
FIG. 5B shows a cross-section view of the fourth semiconductor structure of FIG. 5A along a line 5B-5B of FIG. 5A, in accordance with embodiments of the present invention.

FIG. 5A shows a top-down view of a semiconductor structure 500, in accordance with embodiments of the present invention. FIG. 5B shows a cross-section view of the structure 500 along a line 5B-5B.

With reference to FIGS. 5A and 5B, the structure 500 is similar to the structure 100 of FIGS. 1A and 1C, except that the frame 130 is attached to substrate pads 582 at the top surface 112 of the carrier substrate 110 by solder balls 580. As shown in FIG. 5B, the solder balls 570 of the chip 120 are bonded to the substrate pads 572 at the top surface 112 of the carrier substrate 110. It should be noted that, these solder balls 570 of the chip 120 are not shown in FIGS. 1C, 2B, 3B, 4B, 6B, and 7B for simplicity.

In one embodiment, the fabrication of the structure 500 is as follows. The chip 120 and the frame 130 are placed onto the carrier substrate 110 such that (i) the solder balls 570 of the chip 120 are in direct physical contact one-to-one with the substrate pads 572 of the carrier substrate 110 and (ii) the solder balls 580 of the frame 130 are in direct physical contact one-to-one with the substrate pads 582 of the carrier substrate 110.

Next, in one embodiment, the attachment solder reflow process is performed resulting in the solder balls 570 and 580 bonding to the substrate pads 572 and 582 of the carrier substrate 110, respectively. As a result, the solder balls 570 and 580 are physically attached to the substrate pads 572 and 582 of the carrier substrate 110, respectively.

Next, in one embodiment, the initial cool down process is performed. During the initial cool down process, the frame 130 helps reduce the shrink rate of the carrier substrate 110. Therefore, the frame 130 helps reduce the difference between the shrink rates of the carrier substrate 110 and the chip 120 resulting in a lesser stress on the solder balls 570 and underlying structure of the chip 120 than in the case without the presence of the frame 130. It should be noted that the solder balls 570 of the chip 120 are electrically connected to the pins 360 at the bottom surface 114 through the electrically conductive wires (not shown) in the carrier substrate 110, whereas the solder balls 580 of the frame 130 are not necessarily electrically connected to any pin (similar to the pins 360) at the bottom surface 114. The solder balls 580 help attach the frame 130 to the carrier substrate 110.

In summary, with reference to FIGS. 1C, 2B, 3B, 4B, and 5B, during the initial cool down process, the presence of the frames 130 and 430 help reduce the shrink rate of the carrier substrate 110. Therefore, the frames 130 and 430 help reduce the difference between the shrink rates of the carrier substrate 110 and the chip 120 resulting in a lesser stress on the solder balls 570 and underlying structure of the chip 120 than in the case without the presence of the frames 130 and 430.

Figure 6A:
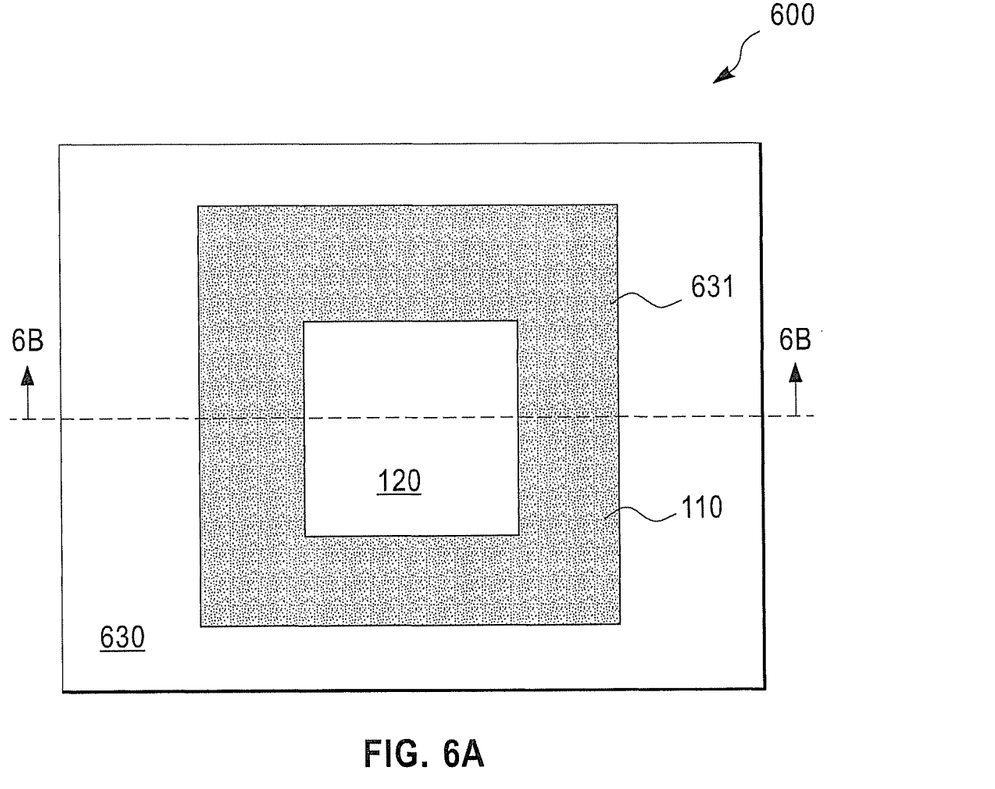
FIG. 6A shows a top-down view of a fifth semiconductor structure, in accordance with embodiments of the present invention.
Figure 6B:
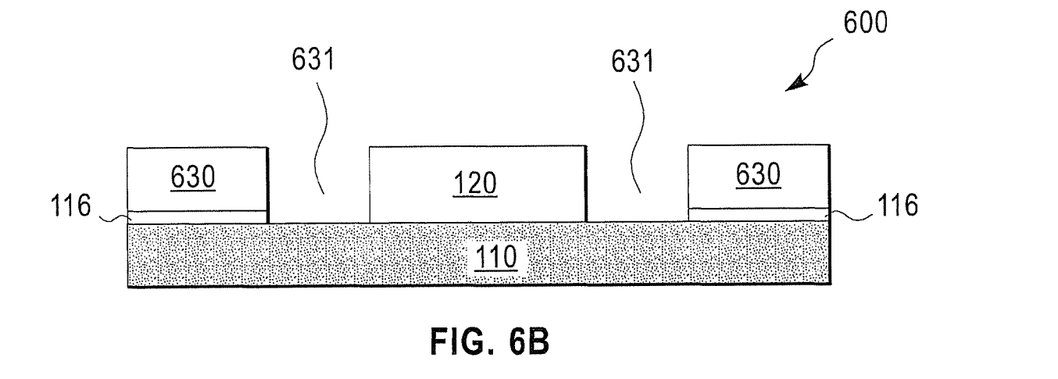
FIG. 6B shows a cross-section view of the fifth semiconductor structure of FIG. 6A along a line 6B-6B of FIG. 6A, in accordance with embodiments of the present invention.

In the embodiments described above, the frames 130 and 430 have circular holes 131 at the centers of the frames 130 and 430. In an alternative embodiment, the frames 130 and 430 have square holes at the centers of the frames 130 and 430. For example, FIG. 6A shows top-down view of a semiconductor structure 600. FIG. 6B shows a cross-section view of the structure 600 of FIG. 6A along a line 6B-6B. With reference to FIGS. 6A and 6B, the structure 600 is similar to the structure 100 of FIGS. 1A and 1C, except that the frame 630 has the square hole 631 at the center of the frame 630. The structure 600 can be formed in a manner similar to the manner in which the structure 100 of FIGS. 1A-1D is formed.

Figure 7A:
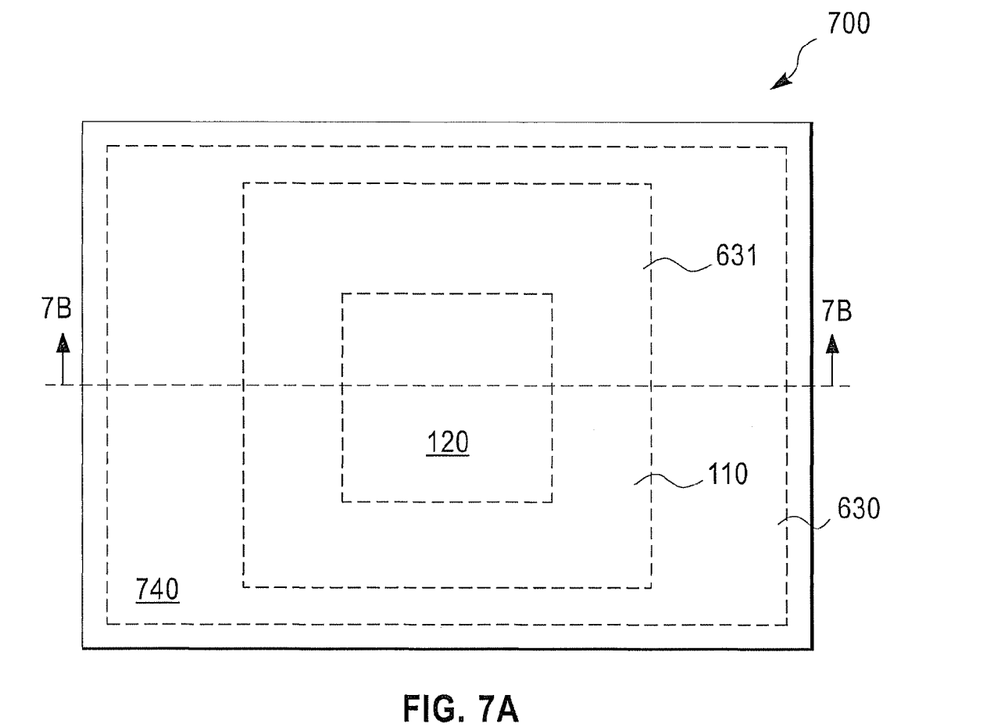
FIG. 7A shows a top-down view of a sixth semiconductor structure, in accordance with embodiments of the present invention.
Figure 7B:
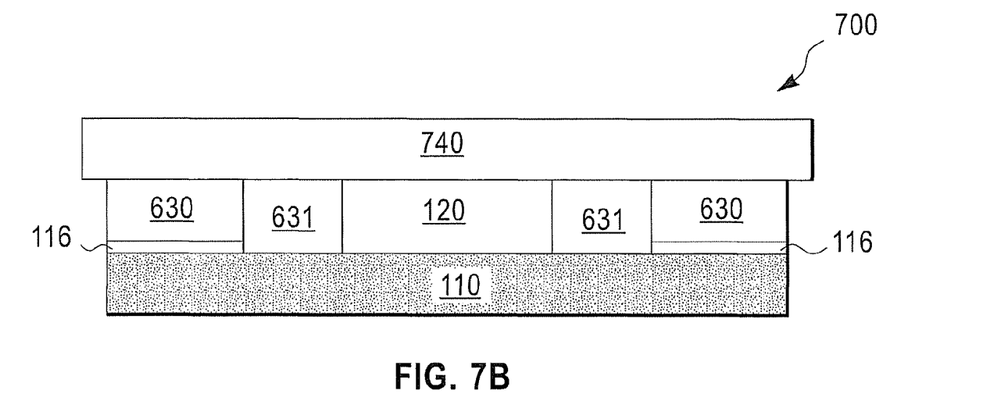
FIG. 7B shows a cross-section view of the sixth semiconductor structure of FIG. 7A along a line 7B-7B of FIG. 7A, in accordance with embodiments of the present invention.

After the structure 600 of FIG. 6A is formed, with reference to FIG. 7A, in one embodiment, a lid 740 can be attached to the chip 120 of FIG. 6A by adhesive resulting in the structure 700 of FIG. 7A. FIG. 7B shows a cross-section view of the structure 700 of FIG. 7A along a line 7B-7B.

In the embodiments described above, with reference to FIGS. 1A-1D, the frame 130 is attached to the carrier substrate 110 in the attachment solder reflow process. More specifically, the frame 130 can be attached to the carrier substrate 110 by applying adhesive to the frame 130 before the attachment solder reflow process is performed and then the adhesive is cured during the attachment solder reflow process (also called attaching the frame 130 to the carrier substrate 110). The frame 130 can be considered being attached to the carrier substrate 110 when the curing is completely done.

In one embodiment, before the frame 130 is attached to the carrier substrate 110, the carrier substrate 110 is gripped on all sides at the edge and then pulled to stretch at room temperature resulting in tensile stress in the carrier substrate 110 (also called pre-stretching process). While the carrier substrate 110 is being stretched (i.e., the carrier substrate 110 is under tensile stress), the frame 130 is attached to the top surface 112 of carrier substrate 110 by adhesive and then the stretching force can be removed. As a result, the tensile stress in the carrier substrate 110 is maintained even after the stretching force is removed. Then, the chip 120 is attached to the carrier substrate 110 by the attachment solder reflow process as described above. After that, the initial cool down process is performed as described above. It should be noted that, after the initial cool down process is performed, the tensile stress is maintained in the carrier substrate 110 by the frame 130 at room temperature. The pre-stressing results in the substrate not expanding significantly when heated, and thus not contracting significantly when cooled. Rather than contracting, the stress (ideally the same as the pre-stress) is returned on cooling. Therefore, the stress on the solder balls and underlying structure of the chip 120 is reduced at room temperature.

In the embodiments described above, the frame 130 is attached to the carrier substrate 110 at the end of the attachment solder reflow process (i.e., when the substrate 110 is at the highest temperature) or before the attachment solder reflow process. In general, the frame 130 can be attached to the carrier substrate 110 at anytime and at any temperature either prior to or during the attachment solder reflow process and the initial cool down process.

In the embodiments described above, the frames have circular or square holes at the center of them. In one embodiment, the frames further comprise additional holes to provide spaces for devices that reside on the carrier substrate 110.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method, comprising:
providing a carrier substrate and a chip, wherein the carrier substrate includes first substrate pads and second substrate pads, and wherein the chip includes first solder balls;
placing the chip on the carrier substrate such that the first solder balls are in direct physical contact with the first substrate pads of the carrier substrate such that at least one solder ball of the first solder balls is in direct physical contact with at least one substrate pad of the first substrate pads;
raising both the carrier substrate and the chip from an initial temperature up to a bonding temperature that is higher than the initial temperature resulting in the first solder balls being physically attached to the first substrate pads of the carrier substrate such that at least one solder ball of the first solder balls is physically attached to at least one substrate pad of the first substrate pads;
cooling both the carrier substrate and the chip from the bonding temperature down to a final temperature after said raising is performed;
attaching a first frame to the carrier substrate before a temperature of the carrier substrate and the chip reaches the final temperature as a result of said cooling being performed, wherein a CTE (coefficient of thermal expansion) of the first frame is substantially lower than a CTE of the carrier substrate, wherein said attaching the first frame is performed before said placing is performed; and
before said attaching the first frame is performed, pre-stretching the carrier substrate resulting in the carrier substrate being under tensile stress,
wherein either said attaching the first frame is performed while said cooling is performed or said attaching the first frame is performed when a temperature of both the carrier substrate and the chip reaches the bonding temperature as a result of said raising being performed.

2. The method of claim 1, wherein said attaching the first frame is performed when the temperature of both the carrier substrate and the chip reaches the bonding temperature as a result of said raising being performed.

3. The method of claim 1, wherein said attaching the first frame is performed while said cooling is performed.

4. Method of claim 1,
wherein a CTE of the first frame is lower than a CTE of the chip.

5. A method, comprising:
providing a carrier substrate and a chip, wherein the carrier substrate includes first substrate pads and second substrate pads, and wherein the chip includes first solder balls;
placing the chip on the carrier substrate such that the first solder balls are in direct physical contact with the first substrate pads of the carrier substrate such that at least one solder ball of the first solder balls is in direct physical contact with at least one substrate pad of the first substrate pads;
raising both the carrier substrate and the chip from an initial temperature up to a bonding temperature that is higher than the initial temperature resulting in the first solder balls being physically attached to the first substrate pads of the carrier substrate such that at least one solder ball of the first solder balls is physically attached to at least one substrate pad of the first substrate pads;
cooling both the carrier substrate and the chip from the bonding temperature down to a final temperature after said raising is performed;
attaching a first frame to the carrier substrate before a temperature of the carrier substrate and the chip reaches the final temperature as a result of said cooling being performed, wherein a CTE (coefficient of thermal expansion) of the first frame is substantially lower than a CTE of the carrier substrate; and
attaching a second frame to the carrier substrate, wherein the carrier substrate is sandwiched between the first and second frames, and wherein said attaching the first frame and said attaching the second frame are performed simultaneously.

6. A method, comprising:
providing a carrier substrate and a chip, wherein the carrier substrate includes first substrate pads and second substrate pads, and wherein the chip includes first solder balls;
placing the chip on the carrier substrate such that the first solder balls are in direct physical contact with the first substrate pads of the carrier substrate such that at least one solder ball of the first solder balls is in direct physical contact with at least one substrate pad of the first substrate pads;
raising both the carrier substrate and the chip from an initial temperature up to a bonding temperature that is higher than the initial temperature resulting in the first solder balls being physically attached to the first substrate pads of the carrier substrate such that at least one solder ball of the first solder balls is physically attached to at least one substrate pad of the first substrate pads;
cooling both the carrier substrate and the chip from the bonding temperature down to a final temperature after said raising is performed;
attaching a first frame to the carrier substrate before a temperature of the carrier substrate and the chip reaches the final temperature as a result of said cooling being performed, wherein a CTE (coefficient of the final expansion) of the first frame is substantially lower than a CTE of the carrier substrate, wherein said attaching the first frame is performed before said placing is performed; and
before said attaching the first frame is performed, pre-stretching the carrier substrate resulting in the carrier substrate being under tensile stress, wherein all sides of the carrier substrate have edges, wherein said pre-stretching is performed at room temperature and comprises gripping all sides of the carrier substrate at the edge of the sides of the carrier substrate and then pulling the gripped carrier substrate to stretch the carrier substrate to place the carrier substrate under tensile stress.

7. The method of claim 6, said method further comprising:
stretching the carrier substrate during which said attaching the first frame to the carrier substrate is performed; and
after said attaching the first frame to the carrier substrate is performed and before said placing is performed, discontinuing said stretching.

8. The method of claim 2, wherein the first frame comprises quartz.

9. The method of claim 2, wherein the first frame comprises a nickel-iron alloy.

10. The method of claim 2, wherein said attaching the first frame comprises attaching the first frame to the carrier substrate by an adhesive layer disposed between the first frame and the carrier substrate, wherein the adhesive layer is continuously distributed throughout an exterior surface of the first frame, and wherein the adhesive layer is continuously distributed on an external surface of the carrier substrate.

11. The method of claim 2, wherein the bonding temperature is in a range of 200 to 250 ° C.

12. The method of claim 3, wherein the first frame comprises quartz.

13. The method of claim 3, wherein the first frame comprises a nickel-iron alloy.

14. The method of claim 3, wherein said attaching the first frame comprises attaching the first frame to the carrier substrate by an adhesive layer disposed between the first frame and the carrier substrate, wherein the adhesive layer is continuously distributed throughout an exterior surface of the first frame, and wherein the adhesive layer is continuously distributed on an external surface of the carrier substrate.

15. The method of claim 4, wherein the first frame comprises quartz.

16. The method of claim 4, wherein the first frame comprises a nickel-iron alloy.

17. The method of claim 4, wherein said attaching the first frame comprises attaching the first frame to the carrier substrate by an adhesive layer disposed between the first frame and the carrier substrate, wherein the adhesive layer is continuously distributed throughout an exterior surface of the first frame, and wherein the adhesive layer is continuously distributed on an external surface of the carrier substrate.

* * * * *